United States Patent [19]
Rohde et al.

[11] Patent Number: 5,160,810
[45] Date of Patent: Nov. 3, 1992

[54] UNIVERSAL SURFACE MOUNT PACKAGE

[75] Inventors: Meta Rohde, Upper Saddle River, N.J.; Shankar R. Joshi, Elmont, N.Y.

[73] Assignee: Synergy Microwave Corporation, Paterson, N.J.

[21] Appl. No.: 823,374

[22] Filed: Jan. 21, 1992

Related U.S. Application Data

[62] Division of Ser. No. 519,844, May 7, 1990, Pat. No. 5,122,621.

[51] Int. Cl.⁵ .......................................... H01L 23/02
[52] U.S. Cl. ................................. 174/52.4; 357/74; 361/404; 361/406
[58] Field of Search ................. 174/52.2, 52.4, 137 R, 174/138 G, 138 E, 152 GM, 260, 261, 262; 361/400, 404, 405, 406; 357/74

[56] References Cited

U.S. PATENT DOCUMENTS

| | | |
|---|---|---|
| 3,061,762 | 10/1962 | Schlegel . |
| 3,119,052 | 1/1964 | Tsuji . |
| 3,195,026 | 7/1965 | Wegner et al. . |
| 3,234,320 | 2/1966 | Wong . |
| 3,351,700 | 11/1967 | Savolainen et al. . |
| 3,489,845 | 1/1970 | Landron . |
| 3,643,133 | 2/1972 | Towell . |
| 3,662,230 | 5/1972 | Redwantz . |
| 3,673,309 | 6/1972 | Dalmasso et al. . |
| 3,721,868 | 3/1973 | Smith, Jr. . |
| 3,801,881 | 4/1974 | Anazawa . |
| 3,816,847 | 6/1974 | Nagao . |
| 3,831,066 | 8/1974 | Gabrail . |
| 3,833,753 | 9/1974 | Garboushian . |
| 3,868,724 | 2/1975 | Perrino . |
| 4,330,683 | 5/1982 | Parker . |
| 4,463,217 | 7/1984 | Orcutt . |
| 4,482,781 | 11/1984 | Burns ............................... 174/52.4 |
| 4,524,238 | 6/1985 | Butt .................................. 174/52.4 |
| 4,527,010 | 7/1985 | Anazawa et al. .................. 174/52.4 |
| 4,614,836 | 9/1986 | Carpenter et al. .................. 174/51 |
| 4,644,096 | 2/1987 | Gutierrez et al. . |
| 4,675,472 | 6/1987 | Krumme et al. ................... 174/52.4 |
| 4,725,692 | 2/1988 | Ishii et al. . |
| 4,805,009 | 2/1989 | Pryor et al. ........................... 357/70 |
| 4,925,024 | 5/1990 | Ellenberger et al. ............... 206/328 |

Primary Examiner—Leo P. Picard
Assistant Examiner—Bot Ledynh
Attorney, Agent, or Firm—Lerner, David, Littenberg, Krumholz & Mentlik

[57] ABSTRACT

A hermetically sealed surface mount electronic component package can be manufactured by converting standard, readily available flat-packs. The package has a base, with an opening through which a primary transmission lead extends, a glass-to-metal seal surrounding the transmission lead in the opening, and a secondary transmission lead extends from the primary transmission lead so that it is spaced from the base and its end is at least flush with the bottom of the base. An insulator can be provided between the primary transmission lead and the secondary transmission lead. A method of converting a standard flat-pack by providing a composite piece having a dielectric insulator, a secondary transmission lead for connection to the transmission lead of the flat-pack, and a connecting member for connecting the insulator and secondary transmission lead to the base of the flat-pack is also described.

22 Claims, 3 Drawing Sheets

FIG. 3
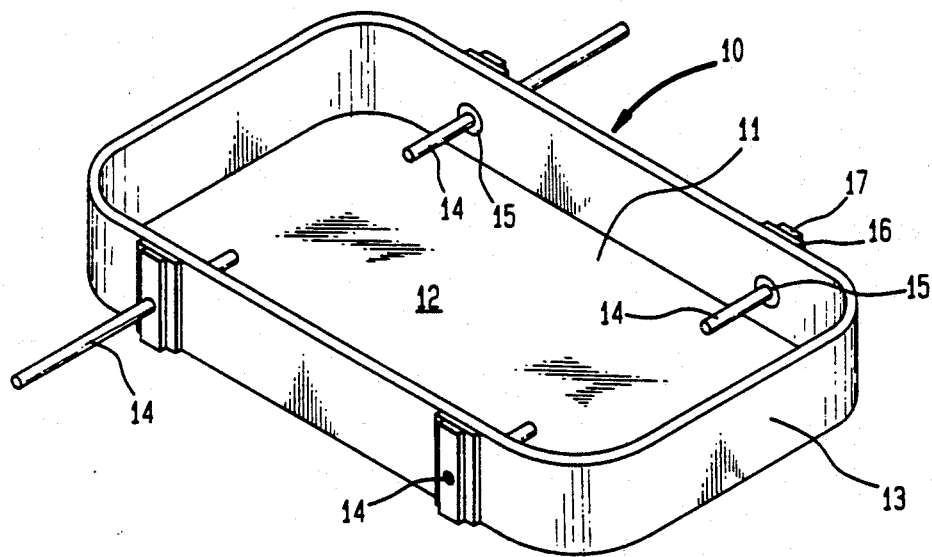
FIG. 4
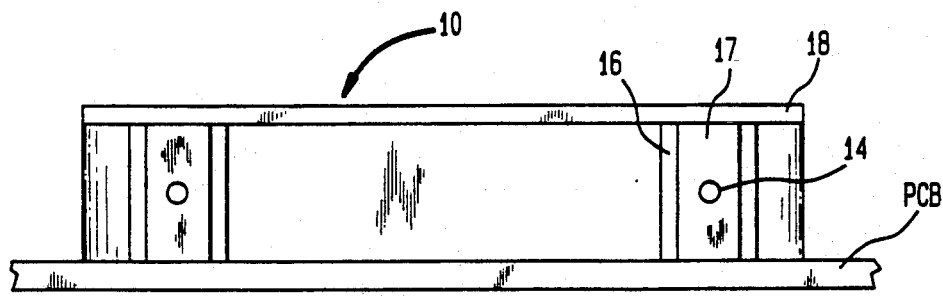
FIG. 5
FIG. 5A
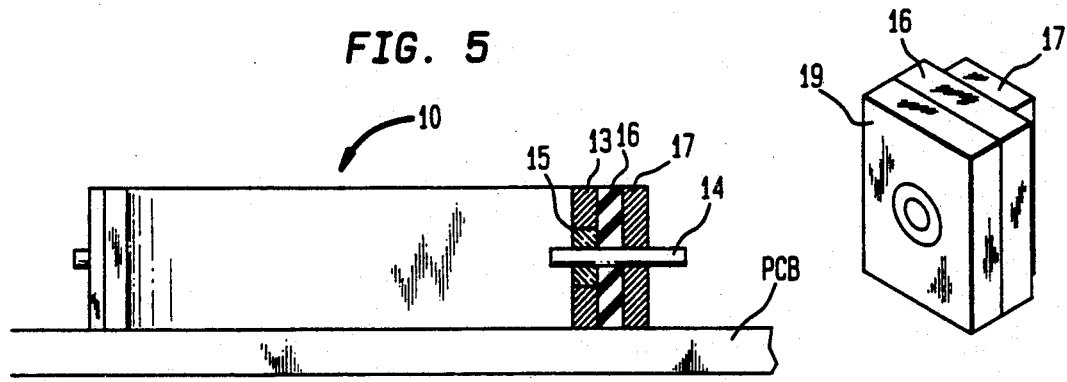

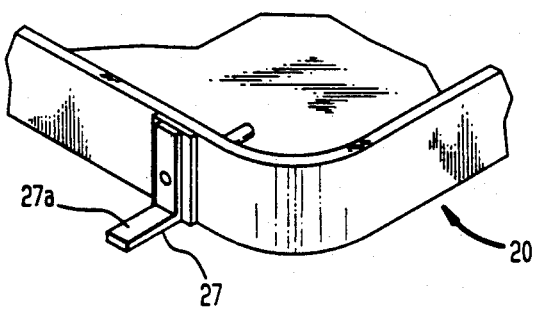
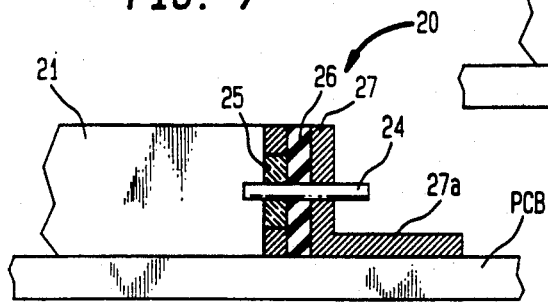
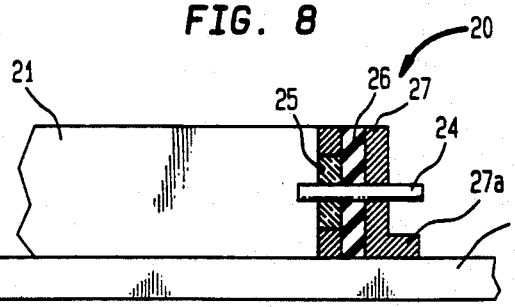
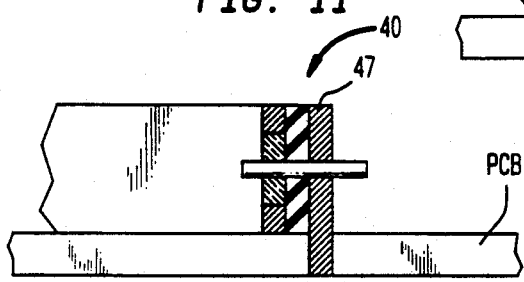
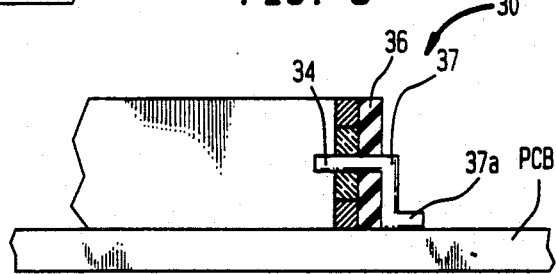
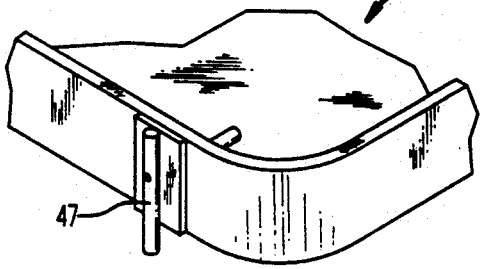

UNIVERSAL SURFACE MOUNT PACKAGE

This is a division of application Ser. No. 07/519,844, filed May 7, 1990, now U.S. Pat. No. 5,122,621.

BACKGROUND OF THE INVENTION

The present invention relates generally to packages for housing electronic circuit components, and more particularly to packages which are adapted to be surface mounted on a printed circuit board or the like without having to manipulate the conducting leads.

In establishing electronic circuits for RF, microwave and other applications, it has been desirable to employ electronic component packages which can be surface mounted to a printed circuit board (PCB), or other substrate. The surface mounting of the package is useful in supporting the package on the printed circuit board, but more importantly provides the advantages of a direct electrical contact or efficient heatsink. The present invention is directed to surface mounted packages which impart such advantages, though the present invention is applicable to packages which are not surface mounted and/or do not include bases adapted to provide a direct electrical contact or a heatsink.

In any type of package, the conducting or transmission leads of the surface mount package must be constructed and arranged so that the electronic components housed in the package can be connected to the other electronic components on the printed circuit board. Such transmission leads include the plug-in type —that is, disposed in holes in a printed circuit board, and subsequently soldered therein so that the connection to the other components on the printed circuit board is effected. This requires access to both sides of the printed circuit board. Thus, the more desirable type of package is the "surface mount" type in which the transmission leads are constructed and arranged to be in the same plane as the resting surface of the base and suitable for "pick and place" assembly where in a large-scale automated assembly line a robot can easily position the package for connection to the printed circuit board without having to insert the transmission leads into holes in the printed circuit board. This requires that the transmission leads, be in contact with the printed circuit board, and, with regard to surface mounted packages, the bottom surface of the package would also be in contact with the printed circuit board.

Since conventional packages, such as the so called "flat-pack", generally designated as A in FIG. 1, include elongate transmission leads which extend through the peripheral walls of the package in a generally horizontal manner, the construction of the package and the printed circuit board had to be reconciled so that the leads would contact the board, and in the case of a surface mounted package, the bottom surface of the package also contacts the board. In many cases, an opening is provided in the printed circuit board so that the bottom surface of the flat-pack hangs in the opening when the transmission leads are resting on the printed circuit board. This adds tremendous costs to the manufacture of the printed circuit board and limited the size of the package which could be used on the printed circuit board because of the mechanical constraints of securing a large package to a printed circuit board so that the connection of the package and its leads to the board will not fail under vibration or shock. Also, a package arranged in this manner can not dissipate heat as efficiently as surface mount packages. Further, this arrangement is susceptible to shorting out by any excess solder contacting the base of the package when soldering the transmission leads to the printed circuit board.

In many instances, the preferable method of mounting a flat-pack of the type shown in FIG. 1 is to manually bend the transmission lead C in two or more places so that the end portion of the transmission lead rests on the printed circuit board, and in the case of surface mounted packages, the bottom surface of the surface mounted packages, the bottom surface of the package itself also rests on the board. Thus, the transmission lead C shown in FIGS. 1 and 2 must be manipulated so that the bottom surface of the end portion is flush with the bottom surface of the package itself. Such manipulation is typically accomplished with a custom tool which is expensive and quite difficult to operate properly. The bent transmission lead E, shown in dashed formation in FIG. 2, illustrates the manner in which the lead and the package should rest on the printed circuit board. U.S. Pat. No. 3,061,762 exemplifies this bending technique for preparing a plug-in or surface mount package for mounting on a printed circuit board.

Few have appreciated the shortcomings of this latter technique which requires the intricate and time-consuming manual manipulation of the transmission leads C of the flat-pack A in FIG. 1. These flat-packs are made in conventional sizes and sold with the transmission leads C in the horizontal position. Further, since these standard packages are used in a variety of applications, the transmission leads C are of considerable length. It is left to the manufacturer of the electronic circuit in which the standard package will be used to not only bend the transmission leads C, but to also ensure that the resulting length thereof is appropriate for the particular printed circuit board. The result is that a large portion of real estate of the printed circuit board is unnecessarily utilized. Referring to FIG. 1, it is noteworthy that the bent transmission lead E is a considerable distance from the peripheral wall of the base B of the flat-pack A. This waste of real estate on a printed circuit board is quite expensive and also requires a larger amount of space to mount the printed circuit board.

Moreover, the considerable length of the transmission lead C required for manual bending is highly undesirable in high frequency applications. Indeed, the bends in the transmission lead E (in dashed formation) are also undesirable in high frequency applications since this amounts to discontinuities. Moreover, it is difficult to bend the plural leads of one package so that they are of the same dimensions with one another or so that they are of the same dimensions as the leads on another package. At high frequencies, this lack of "repeatability" from unit to unit adds to the discontinuities. The long length of the leads and the discontinuity at the bent portions results in losses and mismatches between the package and the other components on the printed circuit board. Thus, antithetical to this generally accepted technique, it is desirable to maintain a lead length which is as short as possible and to avoid manual bending of the leads. Also, the bending of the transmission leads C can result in cracks in the metalization at the corners of the bends where the shear forces are greatest.

Perhaps the greatest disadvantage of this generally accepted technique is the effect on the integrity of the glass-to-metal seal D provided around the transmission lead C to insulate the transmission lead C from the base B and the hermetically seal the opening in which the transmission lead C is disposed. The manual manipulation of the transmission leads C can easily result in hairline fractures in the glass-to-metal seal. Quite often, the damage to the glass-to-metal seal D is not appreciated until there is a failure, and the package must be replaced—by another package which has leads to be bent.

Beyond the above techniques, there is little done in the industry to provide an installation technique or an inexpensive and effective surface mount package which is suitable for most applications, including high frequency applications. For instance, U.S. Pat. No. 4,644,096 discloses a modified TO-8 package in which an L-shaped conducting lead extends through a hole in the base beyond the bottom surface of the base. A glass-to-metal seal is provided around the conducting lead in the opening of the base. A circular copper spacer is specifically provide for connection to the base interiorly of the conducting leads such that the bottom surface of the conducting lead is flush with the bottom surface of the copper spacer. Grounding holes are provided in the base to solder the copper spacer to the base and establish electrical contact therebetween. An epoxy secures the L-shaped lead in the area between the base, glass-to-metal seal and copper spacer. Those skilled in the art will recognize that the intricate structure of the package disclosed in this patent is difficult to manufacture and cost prohibitive. Moreover, the proximity of the L-shaped conducting leads and the copper spacer renders this package highly susceptible to shorting. It is believed that in view of these reasons, the package disclosed in U.S. Pat. No. 4,644,096 has never been successfully commercialized.

U.S. Pat. No. 3,833,753 discloses a package which includes a lead structure made of two leads soldered together and a ceramic wafer element which is metallized on one side. This construction is then connected to the copper base of the package. As with the previously described package, the intricate construction of this package is expensive and difficult to manufacture.

It is thus apparent that an improved electronic component package which overcomes the above shortcomings and disadvantages is warranted. Such an electronic component package would be easy to manufacture, easily installable on a printed circuit board, have substantially no size constraints, could be used for virtually any application, and can replace existing conventional packages without the need to restructure the printed circuit board.

SUMMARY OF THE INVENTION

The present invention relates specifically to a hermetically sealed package for housing electronic circuit elements. The package in accordance with the present invention includes a base member having an opening, a transmission lead extending through said opening, hermetic sealing means disposed in said opening around said transmission lead and a secondary transmission lead connected to and extending from said transmission lead so that it is spaced from said base member and is readily connectable to a printed circuit board or other substrate. Though not required in the preferred embodiment of the present invention, dielectric insulating means can be arranged between said base member and said secondary transmission lead to ensure that said secondary transmission lead is insulated from said base member and to provide additional strength to the structure.

The primary and secondary transmission leads can be integral with one another, or separate elements which are soldered together. An extension can be provided from said secondary transmission lead to provide greater surface area for connection to a printed circuit board. The lower surface of the extension member is desirably flush with the bottom surface of the base member so that both are in contact with the printed circuit board at assembly. In another embodiment, the secondary transmission lead can extend beyond the bottom surface of the base member so that a plug-in type package is provided. In this context, the secondary transmission lead can be made longer so that it extends through the printed circuit board for soldering or bending around the bottom of the board then soldering.

A significant aspect of the present invention is its capability of being manufactured from a conventional package having primary transmission leads extending from the side walls of a base member. To facilitate the conversion of such a conventional package, a composite piece which includes dielectric insulating means and the secondary transmission lead can be utilized. The composite piece also includes connecting means to facilitate the connection of the composite piece to the side wall of the base member adjacent to the primary transmission lead.

A method of converting such a conventional package is also contemplated. After providing a conventional package, a secondary transmission lead is soldered to the primary transmission lead of the conventional package such that the secondary transmission lead extends towards the bottom surface of the package. The excess of the primary transmission lead can then be trimmed or cut. Additional optional steps might include the provision of a dielectric insulating means between the secondary transmission lead and the base member, or the use of a composite piece as above-described.

Accordingly, it is an object of the present invention to provide a universal hermetically sealed surface mount electronic component package which can be employed for virtually any application, including a high frequency application, and occupies less real estate on a printed circuit board.

It is another object of the present invention to provide a hermetically sealed electronic component package with conducting leads which need not be manipulated or bent prior to being assembled on a printed circuit board or the like.

It is another object of the present invention to provide a hermetically sealed electronic component package which can be made by converting a conventional, readily available flat-pack, so that the leads of the new package need not be manipulated or bent prior to being assembled on a printed circuit board or the like.

It is another object of the present invention to provide a method for converting a conventional, readily available flat-pack so that the converted package occupies less real estate on a printed circuit board, and includes leads which need not be manipulated or bent prior to being assembled on a printed circuit board or the like.

It is another object of the present invention to provide an electronic component package having a lead which extends form the peripheral walls of a base member and includes a bottom surface which is flush with the bottom surface of the base member so that when the base member is supported by a printed circuit board, the lead is in contact with the printed circuit board.

It is another object of the present invention to provide an electronic component package which includes a dielectric insulator between the base member and that potion of the conducting lead which is to be connected to a printed circuit board or the like.

It is another object of the present invention to provide an electronic component package which can replace any conventional package, requires no custom tools to arrange for assembly on a printed circuit board, and which possesses one of the disadvantages of difficult manufacture, occupying too much real estate on the printed circuit board, frequently fractured glass-to-metal seal, discontinuities and mismatches, or the like.

BRIEF DESCRIPTION OF THE DRAWINGS

The foregoing and other objects of the present invention will become apparent, as will a better understanding of the concepts underlying the present invention, by reference to the description which follows and refers to the accompanying drawings in which:

FIG. 3 is a perspective view of an electronic component package made in accordance with a first embodiment of the present invention;

FIG. 4 is a side view of the electronic component package shown in FIG. 3 as assembled on a portion of a printed circuit board;

FIG. 5 is a partially cross-sectioned front view of the electronic component package shown in FIG. 3;

FIG. 5A is a perspective view of a composite piece including dielectric insulator encased by conducting materials for use in constructing the secondary transmission lead in the present invention;

FIG. 6 is a broken away perspective view of an electronic component package in accordance with a second embodiment the present invention;

FIG. 7 is a broken away, partially cross-sectioned side view of the electronic component package shown in FIG. 6 as assembled on a printed circuit board;

FIG. 8 is a broken away, partially cross-sectioned side view of the electronic component package shown in FIG. 6 as assembled on a printed circuit board and having a shortened extension lead;

FIG. 9 is a broken away, partially cross-sectioned side view of an electronic component package as mounted on a printed circuit board in accordance with a third embodiment of the present invention;

FIG. 10 is a broken away perspective view of an electronic component package in accordance with a fourth embodiment of the present invention; and FIG. 11 is a broken away, partially cross-sectioned side view of the electronic component package shown in FIG. 10 as assembled on a printed circuit board.

DETAILED DESCRIPTION OF THE INVENTION

Figure 1:
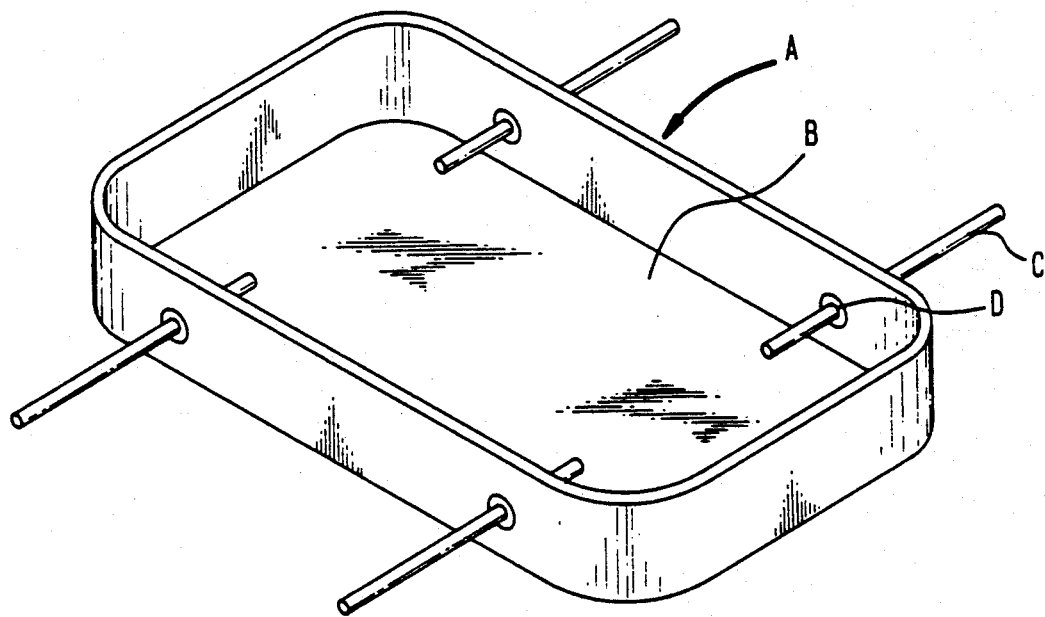
FIG. 1 is a perspective view of a conventional readily available electronic component package (flat-pack)
Figure 2:
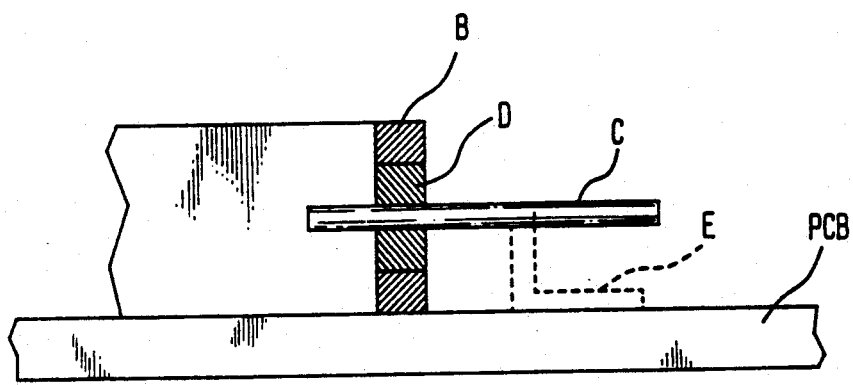
FIG. 2 is a broken away, partially cross-sectioned side view of the conventional flat-pack shown in FIG. 1 together with a portion of a printed circuit board.

Referring to the Figures, FIGS. 1 and 2 illustrate a conventional flat-pack having a structure which, in virtually all cases, must be altered prior to use; FIGS. 3-5 show an electronic component package generally designated as 10 in accordance with a first embodiment of the present invention; FIG. 5A shows a composite piece which can be employed in most embodiments of the present invention; FIGS. 6-8 show portions of an electronic component package generally designated as 20 in accordance with a second embodiment of the present invention; FIG. 9 shows a portion of an electronic component package generally designated as 30 in accordance with a third embodiment of the present invention; and FIGS. 10 and 11 show a portion of an electronic component package generally designated as 40 in accordance with a fourth embodiment of the present invention. For convenience, similar reference numerals (the last digits being identical) have been used in describing the illustrating like elements in each of these embodiments. For instance, the reference numerals "17", "27", "37" and "47" refer to elements which are similar in function.

In FIG. 3, the electronic component package 10 includes a base 11 which has a bottom 12 and four connected peripheral walls 13. The peripheral walls 13 extend upwardly from the periphery of bottom 12 to define an interior region which is adapted to receive electronic components or elements. Conducting or transmission leads 14 extend through holes in the peripheral walls 13. Each of the transmission leads 14 is sealed in its respective opening by glass-to-metal seal 15, though any other type of sealing technique can be employed so long as the respective transmission leads 14 are insulated from the base 11 and the respective openings in the peripheral walls 13 are hermetically sealed thereby. One end of each transmission lead 14 extends into the interior region defined by the bottom 12 and peripheral walls 13 for connection to the electronic components to be housed therein. The other ends of the respective transmission leads must extend beyond the outer surface of the peripheral walls 13 so that these ends can be connected to other lead, as will be described below. The two transmission leads 14 disposed on the rear portion of the electronic component package 10 in FIG. 3 are intentionally shown to have considerable length. The reasons for such illustration will become clear from a description of the method of manufacturing the electronic component package 10 in accordance with the present invention.

The base 11 is preferably made of a material which has at least thermally conductive properties so that the package 10 can act as a heatsink for the electronic components housed therein. In a surface mount situation, the large area of the base 11 which contacts the printed circuit board or the like will provide for the efficient dissipation of heat generated by the components housed in the package 10. In some circumstances, it may be desirable to use a material which is electrically conductive as well as thermally conductive. Use of such materials will, of course, depend upon the specific application and requirements of the package. Some examples of materials which might be used for the base 11 are Kovar, copper, copper alloys and the like. The transmission leads 14 must be made of an electrically conductive material. The glass-to-metal seal 15 can be made of materials other than glass, though a borosilicate glass is conventionally used for this purpose.

A dielectric insulator 16 is connected to the peripheral wall 13, in any conventional manner, such that the transmission lead 14 is exposed, or at least arranged for connection as will now be described. This exposed portion of the transmission lead 14 is connected, by means of solder or otherwise, to a secondary transmission lead 17. A selective etching technique may be used to facilitate the soldering of the secondary transmission lead 17 to the transmission lead 14. In the embodiments illustrated herein, the dielectric insulator 16 and the secondary transmission lead 17 include holes for receiving the transmission lead 14. This is clearly shown by the cross-sectional portion of FIG. 5. Of course, the present invention, only requires that the dielectric insulator 16 insulatedly space the secondary transmission lead 17 from the peripheral wall 13 so that the secondary transmission lead 17 does not contact the base 11 which would short the unit. In fact, the dielectric insulator 16 may not even be required if the secondary transmission lead 17 is spaced from the peripheral wall 13 as air is also an insulator.

Thus, the secondary transmission lead 17 extends towards the bottom 12 of the base 11 in juxtaposition with the peripheral wall 13. The bottom surface of the secondary transmission lead 17 is, in the first embodiment of the present invention, flush with the bottom surface of the bottom 12 of base 11. This construction and arrangement of the secondary transmission lead 17 permits the base 11 of the package 10 to be supported by a printed circuit board (PCB) or the like, while the bottom surface of the secondary transmission lead 17 is in contact with the printed circuit board, as illustrated in FIGS. 4 and 5. FIG. 4 also shows the hermetically sealing cover 18 to complete the arrangement of the package 10 on the printed circuit board.

It is noted that the bottom surface of the secondary transmission lead 17 is flat. This is highly advantageous for connection to a printed circuit board since the round configuration of the leads C shown in FIG. 1 only provides for a tangential portion of the rod-shaped lead C to be in contact with the printed circuit board. Further, such a connection may not be very strong, leaving the possibility that the lead will become disconnected from the board. The lack of area in contact with the printed circuit board with the lead C in FIG. 1 lens to losses and mismatching, while the flat surface of the secondary transmission lead 17 allows a substantial area of the lead to be in contact with the printed circuit board or other substrate.

Turning to FIG. 5A, a composite piece showing a particular arrangement of the dielectric insulator 16 and secondary transmission lead 17 is illustrated prior to connection to the peripheral wall 13. Thus, a member 19 is provided on the side of dielectric insulator 16 remote from the secondary transmission lead 17. Member 19 is preferably made of a material which can be soldered such as copper so that the composite piece shown in FIG. 5A can e applied and soldered to the peripheral wall 13. Of course, it is important that the member 19 and the solder used to attach it to the peripheral walls 13 do not contact the transmission lead 14 or the secondary transmission lead 17. These leads must remain insulated from the base 11. A selective etching technique by, for example, photo lithography, can be employed on member 19 to ensure such insulation. The shaded circular area around the hole in the composite piece in FIG. 5A shows the area which can be etched to ensure that the member 19 does not contact the lead 14.

Thus, it is not apparent that a composite piece of the type shown in FIG. 5A renders the manufacture of the package 10 even easier and less expensive. Indeed, this composite piece comprising the dielectric insulator 16, the member 19 and secondary transmission lead 17 can be a printed circuit board or a piece thereof. This adds further to the low cost and ease of manufacture.

From the foregoing and a comparison of FIGS. 1 and 3, the method of manufacturing the package 10 in accordance with the present invention can be appreciated. Thus, those skilled in the art are aware that the conventional, readily available flat-pack A shown in FIG. 1 can be provided at a particularly low cost. In accordance with the present invention, the flat-pack A can then be converted to have the structure and arrangement of the package 10 as shown in FIG. 3. This is accomplished by connecting the dielectric insulator 16 against the peripheral wall 13 adjacent to the transmission lead 14. The secondary transmission lead 17 can then be soldered to the transmission lead 14 so that it depends downwardly from the transmission lead 14 towards the bottom 12 of the base 11, and at least, in this embodiment, so that its bottom surface is flush with the bottom surface of the bottom 12. The excess length of the transmission lead 14, as shown in the rear portion of FIG. 3, can be removed by cutting the same close to he secondary transmission lead 17, as shown in the front portion of the package 10 in FIG. 3, or as shown in FIG. 5.

The package 10 in accordance with the present invention, whether fabricated by the above-described method of converting a conventional flat-pack or manufactured entirely, does not require that a lead be bent prior to installation on the printed circuit board. Moreover, the package 10 will occupy considerably less real estate on the printed circuit board than would the conventional flat-pack shown in FIG. 1. With regard to the above-described method, it is important that manufacturing costs can be reduced significantly by converting a conventional, readily available flat-pack whereby the converted flat-pack or package 10 possesses considerable advantages over prior art packages.

Referring now to FIGS. 6 and 7, the package 20 in accordance with the second embodiment of the present invention is quite similar to the package 10 in accordance with the first embodiment of the present invention. The differences lie in the structure of the secondary transmission lead which is designated as 27 in accordance with this second embodiment of the present invention. The secondary transmission lead 27 is generally L-shaped in cross-section, as shown in FIG. 7. Thus, extension 27a is provided so that a greater surface area of the secondary transmission lead 27 is in contact with the printed circuit board, and so that the soldering of the secondary transmission lead 27 to the printed circuit board is more easily accomplished. Of course, the extension 27a need not be as exaggerated as shown in FIGS. 6 and 7; but instead can be truncated as shown in FIG. 8.

FIG. 9 illustrates yet another embodiment of the present invention wherein the package 30 includes a transmission lead 34 and secondary transmission lead 37 which are integrally formed. An extension 37a is also shown. As noted above, the dielectric insulator 36 need not be utilized in accordance with the present invention, particularly with respect to this embodiment since the secondary transmission lead 37 is such an integral part of the transmission lead 34, and thus need not be soldered thereto.

Finally, FIGS. 10 and 11 illustrate the last embodiment of the present invention. Though it has been found to be less desirable in many situations, there are still applications which might employ the package 40 as shown in these figures—that is, a plug-in type. Thus, the secondary transmission lead, herein designated as 47 extends below the bottom surface of the base 11 so that a plug-in type package is provided. This plug-in type package 40 is shown in FIG. 11 as mounted on a printed circuit board.

While the foregoing description and figures illustrate some preferred embodiments of the electronic component package in accordance with present invention, it should be appreciated that certain modifications may be made and are encouraged to be made in the structure arrangement and materials of the disclosed embodiments without departing from the spirit and scope of the present invention which is defined by the claims which are set forth immediately hereafter.

What is claimed is:

1. A package for housing electronic circuit elements, said package comprising:
   a. a base member having a bottom with a bottom surface and at least one peripheral wall which together define an interior region for receiving electronic circuit elements, and an opening in said peripheral wall, said base member being adapted to receive cover means to hermetically seal said interior region;
   b. a transmission lead having a first portion disposed in said opening and into said interior region, and a second portion extending towards said bottom surface so that it is at least substantially flush therewith, said second portion being spaced from said peripheral wall;
   c. hermetic sealing means disposed in said opening around said first portion so that said first portion is insulated from said peripheral wall and said opening is hermetically sealed; and
   d. dielectric insulating means between said peripheral wall and said second portion to insulate said second portion from said base.

2. The package in claim 1, wherein said second portion of said transmission lead is substantially flush with the bottom surface of the base.

3. The package in claim 1, wherein said transmission lead has a third portion extending from said second portion, said third portion being adapted to be connected to a printed circuit board or other substrate.

4. The package in claim 3, wherein said third portion includes a lower surface which is substantially flush with the bottom surface of said base member.

5. The package in claim 4, wherein said first portion, second portion and third portion of said transmission lead are integrally formed.

6. The package in claim 1, wherein said second portion of said transmission lead extends beyond the bottom surface of the base.

7. The package in claim 6, wherein said first portion and said second portion of said transmission lead are integral.

8. The package in claim 1, wherein said first and second portions of said transmission lead are integral.

9. The package in claim 1, wherein said second portion of said transmission lead is not integrally formed with said first portion.

10. The package in claim 9, wherein said transmission lead includes a third portion extending from said second portion, said third portion being adapted to be connected to a printed circuit board or other substrate.

11. The package in claim 10, wherein said third portion includes a lower surface, said lower surface being substantially flush with the bottom surface of said base member.

12. The package in claim 9, wherein said second portion is carried by said dielectric insulating means.

13. The package in claim 12, including connecting means to connect said dielectric insulating means to said peripheral wall of said base.

14. The package in claim 13, wherein said connecting means is a connecting member carried by said dielectric insulating means.

15. The package in claim 14, wherein said connecting member is soldered to said peripheral wall of said base such that said connecting member is not in contact with said first portion of said transmission lead.

16. The package in claim 15, wherein said second portion of said transmission lead is substantially flush with the bottom surface of the base.

17. The package in claim 16, wherein said transmission lead includes a third portion extending from said second portion and away from said base, said third portion having a lower surface which is substantially flush with said bottom surface of said base and is adapted to be connected to a printed circuit board or other substrate.

18. The package in claim 15, wherein said dielectric insulating means and said second portion and said connecting member carried thereby is at least a piece of a printed circuit board adapted to be connected to said peripheral wall and said first portion of said transmission lead to form said package.

19. The package in claim 9, wherein a plurality of transmission leads, hermetic sealing means and dielectric insulating means are provided for a plurality of openings in said base.

20. The package in claim 12, wherein said base is made of material which is thermally conductive.

21. The package in claim 20, wherein said base is made from material which is also electrically conductive.

22. The package in claim 12, wherein said base is made of material which is electrically conductive.

* * * * *

UNITED STATES PATENT AND TRADEMARK OFFICE
CERTIFICATE OF CORRECTION

PATENT NO. : 5,160,810

DATED : November 3, 1992

INVENTOR(S) : Rohde et al.

It is certified that error appears in the above-identified patent and that said Letters Patent is hereby corrected as shown below:

```
Column 5, line 4, "potion" should read --portion--.
Column 5, line 10, "one" should read --none--.
Column 6, line 11, "the" should read --and--.
Column 7, line 60, "not" should read --now--.
```

Signed and Sealed this

Nineteenth Day of October, 1993

Attest:

BRUCE LEHMAN

Attesting Officer

Commissioner of Patents and Trademarks